United States Patent
Wang (10) Patent No.: US 9,117,053 B2
(45) Date of Patent: Aug. 25, 2015

(54) ENHANCED OPTICAL PROXIMITY CORRECTION (OPC) METHOD AND SYSTEM

(71) Applicants: Semiconductor Manufacturing International (Beijing) Corporation, Beijing (CN); Semiconductor Manufacturing International (Shanghai) Corporation, Shanghai (CN)

(72) Inventor: Hui Wang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/508,022

(22) Filed: Oct. 7, 2014

(65) Prior Publication Data

US 2015/0113486 A1    Apr. 23, 2015

(30) Foreign Application Priority Data

Oct. 23, 2013 (CN) .......................... 2013 1 0505289

(51) Int. Cl.
*G06F 17/50* (2006.01)
*G03F 1/36* (2012.01)

(52) U.S. Cl.
CPC .............. *G06F 17/5081* (2013.01); *G03F 1/36* (2013.01)

(58) Field of Classification Search
CPC .......................... G06F 17/5045; G06F 17/5081
See application file for complete search history.

(56) References Cited

U.S. PATENT DOCUMENTS

| 8,331,646 B2* | 12/2012 | Agarwal et al. ............... 382/144 |
| 2005/0044513 A1* | 2/2005 | Robles et al. ..................... 716/4 |
| 2007/0157154 A1* | 7/2007 | Socha ............................. 716/21 |
| 2007/0260437 A1* | 11/2007 | Coskun et al. ................... 703/6 |
| 2007/0282574 A1* | 12/2007 | Huang et al. ..................... 703/2 |
| 2010/0167184 A1* | 7/2010 | Wong et al. ...................... 430/5 |
| 2011/0219342 A1* | 9/2011 | Socha ............................ 716/52 |
| 2011/0283244 A1* | 11/2011 | Abdo et al. ..................... 716/55 |

* cited by examiner

*Primary Examiner* — Nha Nguyen
(74) *Attorney, Agent, or Firm* — Anova Law Group, PLLC (57) ABSTRACT

An enhanced optical proximity correction method is provided. The method includes providing a mask substrate and a substrate and obtaining a customer target pattern. The method also includes obtaining a production layout by performing an optical proximity correction process onto the customer target pattern using the pattern and a pattern formed on the substrate. Further, the method includes obtaining the light intensity information instead of dimension of the production layout. Further, the method includes storing the light intensity information of the production layout, the production layout and surrounding coherence radius in an optical proximity correction model database if the light intensity information of the production layout does not coincide with light intensity information of original modeling patterns already stored in the optical proximity correction model database. Further, the method also includes generating actual patterns using the stored optical proximity correction model corresponding to the stored light intensity information.

15 Claims, 5 Drawing Sheets

ENHANCED OPTICAL PROXIMITY CORRECTION (OPC) METHOD AND SYSTEM

CROSS-REFERENCES TO RELATED APPLICATIONS

This application claims the priority of Chinese patent application No. 201310505289.8, filed on Oct. 23, 2013, the entirety of which is incorporated herein by reference.

FIELD OF THE INVENTION

The present invention generally relates to the field of semiconductor manufacturing technology and, more particularly, relates to advanced optical proximity correction methods and systems.

BACKGROUND

The manufacturing technology of integrated circuits (IC) is a complex process; and it may be updated for approximately every 18 months to 24 months. A major parameter for evaluating the manufacturing technology of ICs is the minimum feature size of the ICs. The minimum feature size of ICs is also referred as a critical dimension (CD). The critical dimension of ICs has been reduced from the initial size of 125 µm to the current size of 0.13 µm or below. Such a reduction of the critical dimension of ICs may cause forming millions of devices in a single chip to be possible.

Photolithography has always been a major driving force of the development of the manufacturing process of ICs. Comparing with other individual fabrication processes of the manufacturing of ICs, a photolithography process may be a revolutionary contribution to the improvement of ICs. Before performing a photolithography process, the structure of ICs may be replicated (or written) on a mask larger than the wafer of ICs by certain processes. The mask may be made of quartz or glass, etc. Then, the structure of ICs on the mask may be transferred onto the wafer using an ultraviolet light with a certain wavelength generated by a photolithography apparatus. For example, the wavelength of the ultraviolet light may be 248 nm.

When the circuit structure on the mask is transferred to the wafer by a photolithography process, a pattern distortion may occur, especially when the technical node enters into 0.13 µm or below. If such a distortion is not corrected, the entire manufacturing technology (process) may fail. The pattern distortion may be caused by the optical proximity effect (OPE). The exposure system of the photolithography apparatus forms an image using a partial coherent light system. Theoretically, the amplitude of the spectrum of the image may distribute differently along different directions. However, because of the limitation of the imaging system caused by the optical diffraction and the non-linear filtering when the critical dimension becomes significantly small, the energy of the exposure light may be lost in certain directions during the photolithography process. Such an energy lost may cause the image space to have a rounding and shrinking effect, etc.; and such an effect may be referred as the optical proximity effect (OPE).

In order to correct the pattern distortion caused by the OPE, a widely used method in the field of semiconductor manufacturing is to do a pre-structure-correction on the mask. Such a correction method is referred as an optical proximity correction (OPC). The basic principle of the OPC is to pre-correct the patterns of the IC design so as to cause the pre-correction of the patterns to be able to compensate the OPE caused by the photolithography apparatus. Therefore, by using the mask having the patterns formed by the OPC, after the photolithography process, the initially desired patterns of the ICs may be obtained.

The test patterns of the existing OPC models are usually stored in an OPC model database; and can be called when they are needed. However, the quantity of the stored OPC models (the mask patterns obtained be the OPC process) in the OPC model database may be limited; and it may be unable to include all the new circuit patterns (layout) designed by customers. The disclosed methods and systems are directed to solve one or more problems set forth above and other problems.

BRIEF SUMMARY OF THE DISCLOSURE

The present disclosure includes an enhanced optical proximity correction method. The method includes providing a mask substrate and a substrate and obtaining a customer target pattern. The method also includes obtaining a production layout by performing an optical proximity correction process onto the customer target pattern using the customer pattern and a pattern formed on the substrate. Further, the method includes obtaining the light intensity information of the production layout instead of dimensions. Further, the method includes storing the light intensity information of the production layout, the production layout and surrounding coherence radius in an optical proximity correction model database if the light intensity information of the production layout does not coincide with light intensity information of original modeling patterns already stored in the optical proximity correction model database. Further, the method also includes generating actual patterns using the stored optical proximity correction model corresponding to the stored light intensity information of the production layout, the production layout, and surrounding coherence radius.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 5:
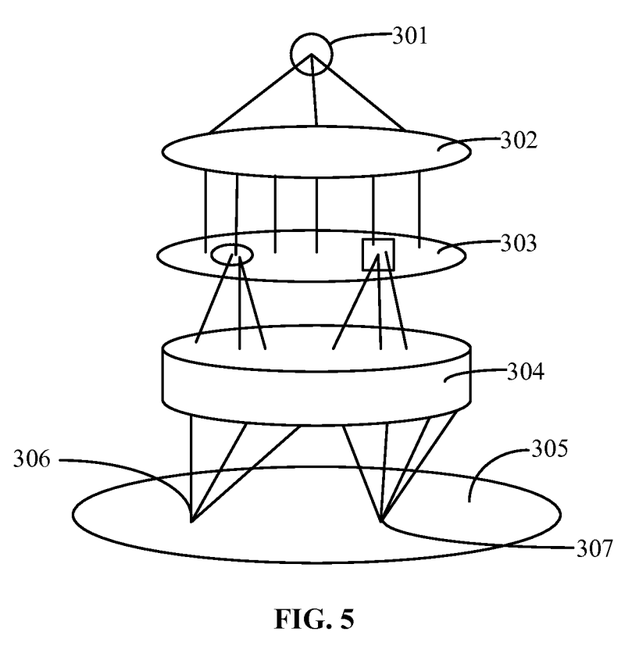
FIG. 5 illustrates a photolithography system consistent with the disclosed embodiments.

FIG. 5 illustrates a photolithography system used for performing an enhanced optical proximity correction process. As shown in FIG. 5, the photolithography system may include a light source 301, an illumination lens 302, a mask 303, a projection lens system 304, and a substrate 305. During a lithography process, light from the light source 301 may become parallel light after it passing through the illumination lens 302. Then, the parallel light may pass through the mask 302 and the projection lens system 304, and may finally form a pattern image on the substrate 305.

Further, the photolithography system also includes a processing unit (not shown). The processing unit may at least include a processor and a data storage unit, etc. The processor may be used to perform certain data analysis; control the motion of the components of the photolithography system; and perform certain type of calculations, etc. The data storage unit may be used to store the process data, and OPC models, etc.

Figure 1:
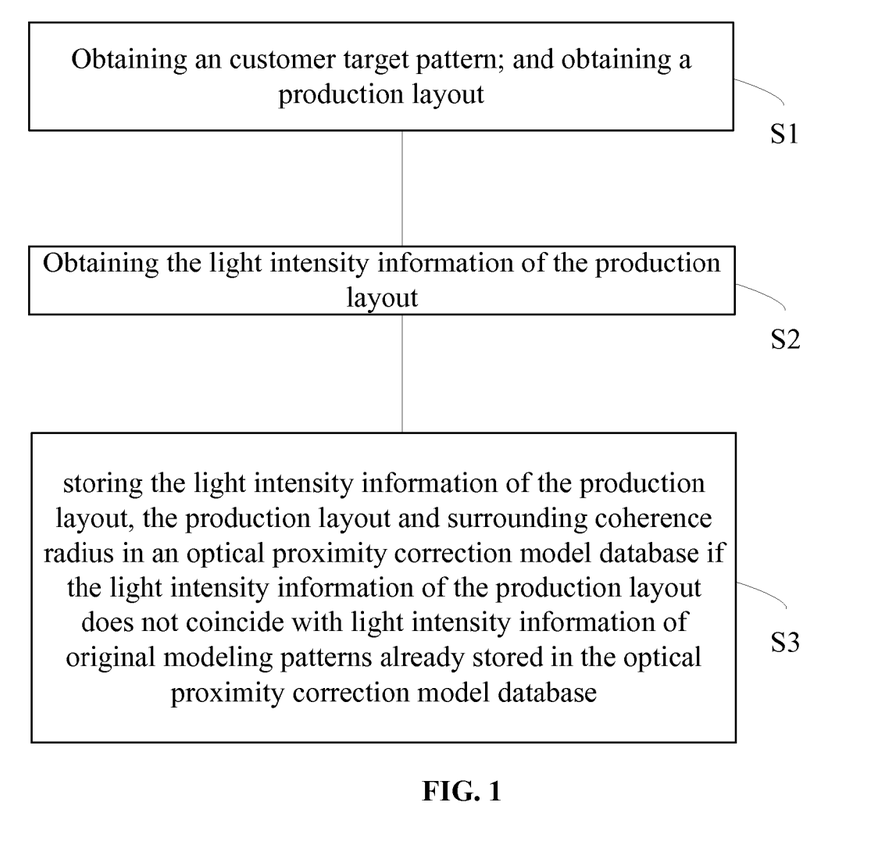
FIG. 1 illustrates an exemplary enhanced optical proximity correction method consistent with disclosed embodiments.
Figure 2:
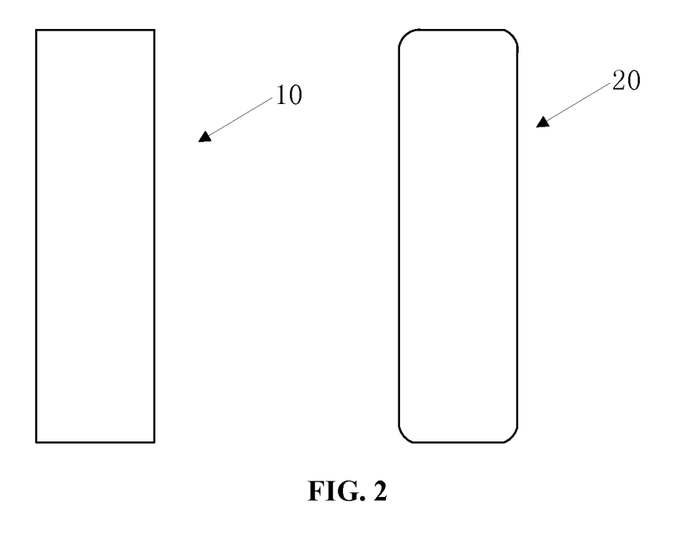
FIG. 2 illustrates a customer target pattern and a corrected pattern obtained by an optical proximity correction model corresponding to the customer target pattern consistent with the disclosed embodiments.

FIG. 1 illustrates an exemplary enhanced optical proximity correction method consistent with the disclosed embodiments. As shown in FIG. 1, at the beginning of the process; a customer target pattern is obtained; and an optical proximity correction (OPC) process may be performed onto the customer target pattern (S1). FIG. 2 illustrates a customer target pattern before and after the OPC process.

As shown in FIG. 2, the pattern 20 illustrates a corresponding pattern of the customer target pattern 10 after the OPC process. The pattern 20 obtained by the OPC process may be referred as a production layout 20. The light intensity of the production layout 20 may be subsequently used to compare with the light intensity of the original modeling patterns already stored in the OPC model database to obtain a new cover-all modeling pattern.

The customer target pattern 10 and the production layout 20 may be formed on a mask substrate, such as quartz, or glass etc. In certain other embodiments, the customer target pattern 10 may be computer-simulated patterns.

An OPC model may include an optical model and a resist model. In the OPC process, the optical model may be used firstly. The optical model may illustrate the spatial light intensity distribution on the wafer after the light from the light source being diffracted by the lens system of the photolithography apparatus when the light irradiates the pattern on the mask. After obtaining the light intensity distribution, the resist model may be then used. The resist model may simulate the light intensity distribution on a photoresist layer. When the light intensity is greater than a reference exposure threshold value, the portion of the photoresist layer exposed by the light may be chemically changed; and may be dissolved by a developing agent. The resist model may be any appropriate type, such as a constant threshold resist model, or a variable threshold resist model. In one embodiment, the constant threshold resist model may be used. The constant threshold resist model may refer that the reference exposure threshold is a constant. Comparing to the variable threshold resist model, the constant threshold resist model may simply the resist model. Such a simplified resist model may avoid a complexity caused by obtaining the OPC model using a relatively complex resist model.

Figure 6:
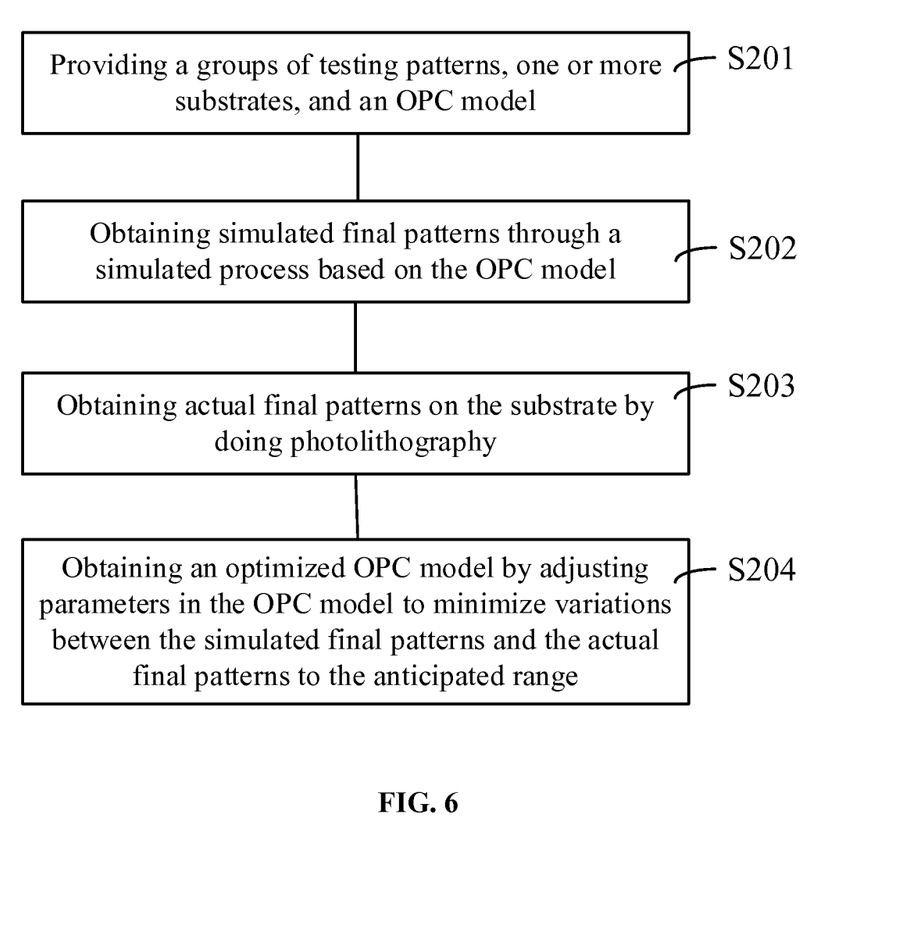
FIG. 6 illustrates an exemplary optical proximity correction process consistent with the disclosed embodiments.

FIG. 6 illustrates an exemplary optical proximity correction (OPC) process consistent with the disclosed embodiments. As shown in FIG. 6, the OPC process may include the following steps:

Step S201, providing a plurality of groups of testing patterns, one or more substrates and an OPC model established previously. The testing patterns may be formed on the mask substrate by any appropriate process, such as a laser writing process, or a printing process, etc.

Step S202, obtaining simulated final patterns through a simulated exposure on the test patterns based on the OPC model. The simulated patterns may be obtained by the processing unit of the system illustrated in FIG. 5.

Step S203, obtaining actual final patterns on the substrate by a photolithography process using the test patterns as a mask. The actual final patterns may be formed by the system illustrated in FIG. 5.

Step S204, obtaining variations between the simulated final patterns and the actual final patterns. If the variations are beyond the anticipated range, it may need to adjust the OPC model, and then repeat the above steps until the variations between the simulated final patterns and the actual final patterns are within the anticipated range.

Thus, the customer layout 20 may be obtained. Further, the OPC model may be stored in an OPC model database in the processing unit of the system illustrate in FIG. 5, and actual patterns are created based on the OPC model. The patterns may be used to subsequently form various semiconductor structures.

Figure 3:
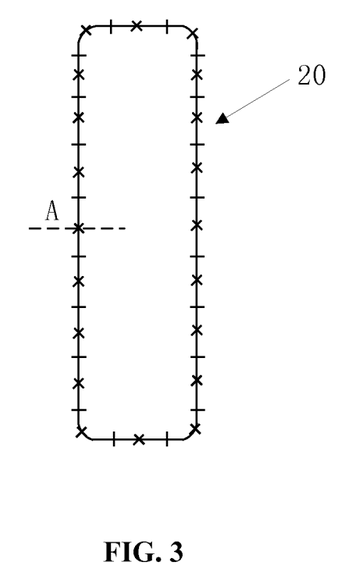
FIG. 3 illustrates the decomposed sides of the patterns obtained by an optical proximity correction process consistent with the disclosed embodiments.

Retuning to FIG. 1, after obtaining the production layout 20 using the OPC process; the light intensity information of the production layout 20 may be obtained (S2). FIG. 3 illustrates a corresponding structure.

A process for obtaining the light intensity information of the production layout 20 obtained by the OPC process may include decomposing the sides of the production layout 20 into a plurality of the segments; obtaining the spatial light intensity distribution curve of each of the segments of the production layout 20; obtaining the slope of the spatial light intensity distribution curve of the segment at the reference exposure threshold of the photoresist according to the spatial light intensity distribution curve; and obtaining the maximum light intensity and the minimum light intensity in a first space rang using the intersection point of the reference exposure threshold of the photoresist and the spatial light intensity distribution curve of the segment.

As shown in FIG. 3, the sides of the production layout 20 are decomposed into a plurality of segments. The length of each of the segments may be similar or different. In one embodiment, the length of the segments, may also be referred as a step size, is similar. The parameters for decomposing the sides of the production layout 20 may refer to the corresponding parameters of the OPC process. The process for obtaining the light intensity information of the customer layout 20 may be performed by the processing unit of the system illustrated in FIG. 5.

Further, a plurality of test points (not shown) may be picked up in the inner regions and outer regions of the production layout 20 along a line (the dashed line shown in FIG. 3) vertical to the side of the production layout 20 using the center point of the segment as a center. A spatial light intensity distribution curve may be drawn using the light intensity of each of the test points. The light intensity distribution curve may be used to represent the light intensity distribution information of the segment. After traversing all the segments of the production layout 20, the light intensity information of the production layout 20 may be obtained.

In one embodiment, the spatial light intensity distribution curve of the production layout 20 obtained by the OPC process may be the spatial light intensity distribution on an optimal focus plane. Comparing with the off-focus plane, the photoresist may obtain an optimized critical size on the optimal focus plane when the optimal focus plane is used.

Figure 4:
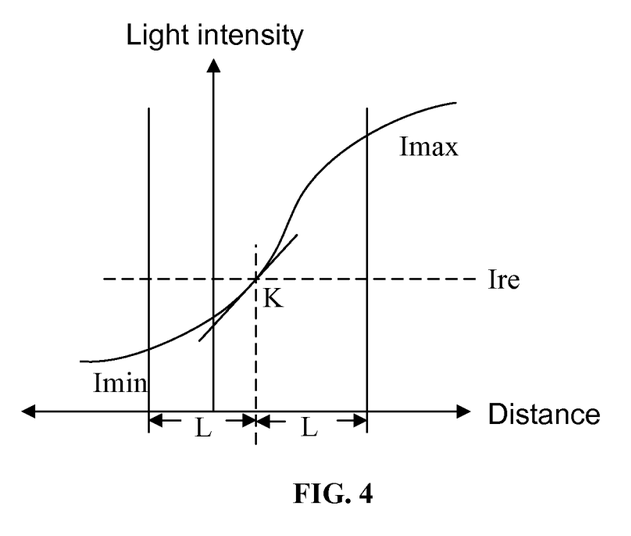
FIG. 4 illustrates the light intensity of a segment illustrated in FIG. 3 at which the point "A" locates consistent with the disclosed embodiments.

In one embodiment, referring to FIG. 3, the center point of a segment of the side of the production layout 20 may be referred as "A". The spatial light intensity distribution curve of the point "A" in the inner regions and the outer regions of the segment is illustrated in FIG. 4. As shown in FIG. 4, the spatial light intensity distribution curve of the segment having the point "A" may have an intersection point with the reference exposure threshold "Ire" of the photoresist. A maximum light intensity "Imax" and the minimum light intensity "Imin" may be found within the first space range "L".

Referring to FIG. 4, the first space range "L" may refer to a space range using the intersection point as the center and a length "L" at both sides of the center as a search range. That is, the first space range is a certain search range using the intersection point of the reference exposure threshold and the spatial light intensity distribution curve as the center. In order to lower the computation task, the length "L" may be approximately $(2.5\lambda/NA)/(1+\delta)$. Where refers to the wavelength of the exposure light; NA refers to the numerical aperture; and $\lambda$ refers to the spot size of the exposure light.

Returning to FIG. 1, after obtaining the light intensity information of the production layout 20 obtained by the OPC process, the light intensity information of the production layout 20 obtained by the OPC process, the production layout 20 obtained by the OPC process and the surrounding coherence radius may be stored in the OPC model database in the processing unit of the system illustrated in FIG. 5 if the light intensity information of the production layout 20 obtained by the OPC process does not coincide with the light intensity information of the original modeling patterns stored in the OPC model database (S3). The light intensity information of the production layout obtained by the OPC process coinciding with the light intensity of the original modeling patterns stored in the OPC model database may refer that the slope of the spatial light intensity distribution curve at the reference exposure threshold, the maximum light intensity within the first space range and the minimum intensity within the first space range of each of the segments of the production layout 20 obtained by the OPC process may be equal to the slope the spatial light intensity distribution curve at the reference exposure threshold, the maximum light intensity within the first space range and the minimum intensity within the first space range of each of the corresponding segments of the original modeling patterns already stored in the OPC model database.

If the slope of the spatial light intensity distribution curve at the reference exposure threshold, the maximum light intensity within the first space range and the minimum intensity within the first space range of each of the segments of the production layout 20 obtained by the OPC process is equal to the spatial light intensity distribution curve at the reference exposure threshold, the maximum light intensity within the first space range and the minimum intensity within the first space range of each of the corresponding segments of the original modeling patterns stored in the OPC model database, the production layout 20 obtained by the OPC process may have been already stored in the OPC model database. If the slope of the spatial light intensity distribution curve at the reference exposure threshold, the maximum light intensity within the first space range and the minimum intensity within the first space range of each of the segments of the production layout obtained by the OPC process is not equal to the spatial light intensity distribution curve at the reference exposure threshold, the maximum light intensity within the first space range and the minimum light intensity within the first space range of each of the corresponding segments of the original modeling patterns stored in the OPC model database, the production layout 20 obtained by the OPC process may have not been stored in the OPC model database. In order to cause the modeling patterns stored in the OPC model database to completely cover the production layout, the information of the production layout 20 obtained by the OPC process and related information may be stored in the OPC model database to enlarge the coverage of the OPC model database.

Further, the related information may include the coherence radius of the production layout 20 obtained by the OPC process. In one embodiment, the coherence radius may be at least $(20\lambda/NA)/(1+\delta)$. Where refers to the wavelength of the exposure light; NA refers to the numerical aperture; and $\lambda$ refers to the spot size of the exposure light.

The light intensity information of the original modeling patterns stored in the OPC model database may include the slope of the spatial light intensity distribution curve of the segments of the original modeling pattern at the reference exposure threshold, the maximum light intensity of each segment in the first space range, and the minimum light intensity of each segment in the first space range, etc. In one embodiment, in order to obtain an optimal photoresist size after an exposure process, the optimal spatial light intensity distribution of each of the segments of the original modeling patterns stored in the OPC model database may be the spatial light intensity distribution on the optimal focus plane.

The segments of the original modeling patterns stored in the OPC model database may be obtained by any appropriate process. For example, the segments of the original modeling patterns stored in the OPC database may be obtained by decomposing the sides of the original modeling patterns into segments. The segments of the original modeling patterns stored in the OPC model database may be equal, or may be different. In order to correctly compare the light intensity information of the production layout 20 obtained by the OPC process and the light intensity information of the original modeling patterns stored in the OPC model database, the parameters for decomposing the sides of the production layout 20 obtained by the OPC process and the parameters for decomposing the sides of the original modeling patterns stored in the OPC model database may be same. For example, the decomposing step size may be same.

Therefore, the light intensity information of the production layout obtained from the customer target pattern by the OPC process may be compared with light intensity information of the original modeling patterns stored in the OPC model database. If such two light intensity information does not coincide, the light intensity information of the production layout obtained from the customer target pattern by the OPC process, the production layout obtained from the customer target pattern by the OPC process and the coherence radius may be stored in the OPC model database.

When the intensity information and other related information of the production layout 20 is stored in the OPC model database after the comparison, the production layout 20 may be merged with the original modeling patterns. Therefore, a final cover-all modeling pattern may be formed in the OPC model database in process unit of the system illustrated in FIG. 5; and the coverage of the OPC model database may be extended.

The disclosed method for obtaining the OPC model may have a plurality of advantages. First, the disclosed method compares the light intensity information instead of size. If the only the size is compared, edge errors may be generated. If there is a third pattern in the edge region of the mask which has the customer target pattern, the third pattern in the edge region may coherent with the customer target pattern. Such coherence may cause the OPC of the customer target pattern not to match the design requirements. Second, the disclosed method may not only stores the light intensity information and the production layout obtained by the OPC process, but also stores the coherent radius around the production layout obtained by the OPC process. Thus, possible errors caused by only storing the existence of the third pattern on the production layout obtained by the OPC process may be avoided.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An enhanced optical proximity correction method, comprising:
    providing a mask substrate and a substrate;
    forming a customer target pattern on the mask substrate;
    obtaining a production layout by performing an optical proximity correction process onto the customer target pattern using the customer target pattern and a pattern formed on the substrate;
    obtaining light intensity information of the production layout instead of dimension by:
        decomposing sides of the production layout into a plurality of segments, drawing a spatial light intensity distribution curve of each of a plurality of test points picked up from a line vertical to a segment, and searching for a maximum light intensity and a minimum light intensity in a first space range using an intersection point of the spatial light intensity distribution curve and a reference exposure threshold as a center,
        wherein the line is through the center point of the segment and the test points are in inner regions and outer regions at both sides of the segment;
    storing the light intensity information of the production layout, storing the production layout, and storing surrounding coherence radius in an optical proximity correction model database if the light intensity information of the production layout does not coincide with light intensity information of original modeling patterns already stored in the optical proximity correction model database; and
    generating actual patterns using the stored optical proximity correction model corresponding to the stored light intensity information of the production layout, the production layout, and surrounding coherence radius.

2. The method according to claim 1, after storing the light intensity information of the production layout, the production layout and the surrounding coherence radius, further including:
    merging the production layout with an original modeling pattern to form a final cover-all modeling pattern.

3. The method according to claim 1, wherein the light intensity information of the production layout further includes:
    a slope of the spatial light intensity distribution curve of each of the segment of the production layout at a reference exposure threshold; and
    the maximum light intensity and the minimum light intensity within the first space region.

4. The method according to claim 1, wherein the light intensity information of the original modeling patterns further includes:
    a slope of a spatial light intensity distribution curve of each of the segments of the original modeling pattern at a reference exposure threshold; and
    the maximum light intensity and the minimum light intensity within a first space region.

5. The method according to claim 1, wherein the light intensity information of the production layout coinciding with light intensity information of original modeling patterns further includes:
    a slope of a spatial light intensity distribution curve of each of the segments of the production layout at a reference exposure threshold, the maximum light intensity and the minimum light intensity within the first space region is equal to a slope of a spatial light intensity distribution curve of each of the segments of the original modeling pattern at a reference exposure threshold, the maximum light intensity and the minimum light intensity within the first space region.

6. The method according to claim 1, wherein:
    a resist model with a constant exposure threshold is used to analyze the light intensity.

7. The method according to claim 1, wherein:
    decomposing parameters of each side of the production layout is same as decomposing parameters of the original modeling patterns.

8. The method according to claim 7, wherein:
    one of the decomposing parameters is step size.

9. The method according to claim 1, wherein:
    the first space range is at least $(2.5\lambda/NA)/(1+\delta)$;
    $\lambda$ refers to a wavelength of an exposure light;
    NA refers to a numerical aperture; and
    $\delta$ refers to a spot size of the exposure light.

10. The method according to claim 1, wherein:
    the surrounding coherence radius the production layout is at least $(20\kappa/NA)/(1+\delta)$;
    $\lambda$ refers to a wavelength of an exposure light;
    NA refers to a numerical aperture; and
    $\delta$ refers to a spot size of the exposure light.

11. The method according to claim 1, wherein:
    the reference exposure threshold of each of the segments of the production layout is equal.

12. The method according to claim 1, wherein:
    the spatial light intensity distribution curve of each of the segments of the production layout is the spatial light intensity distribution on an optimal focus plane.

13. The method according to claim 1, wherein:
    the spatial light intensity distribution curve of each of the segments of the original modeling pattern is the spatial light intensity distribution on an optimal focus plane.

14. The method according to claim 1, wherein the optical proximity correction process further includes:
    providing a plurality of groups of testing patterns, one or more substrates and an OPC model established previously;
    obtaining simulated final patterns through a simulated exposure on the test patterns based on the OPC model;
    obtaining actual final patterns on the substrate by a photolithography process using the test patterns as a mask; and
        obtaining variations between the simulated final patterns and the actual final patterns, and if the variations are beyond an anticipated range, adjusting the OPC model, and then repeating the above steps until the variations between the simulated final patterns and the actual final patterns are within the anticipated range.

15. The method according to claim 1, wherein:
the mask substrate is a quartz substrate.

* * * * *